(12) United States Patent
Takahashi (10) Patent No.: US 8,921,705 B2
(45) Date of Patent: Dec. 30, 2014

(54) WIRING BOARD AND FABRICATION METHOD THEREFOR

(75) Inventor: Michimasa Takahashi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 750 days.

(21) Appl. No.: 12/537,607

(22) Filed: Aug. 7, 2009

(65) Prior Publication Data

US 2010/0132980 A1 Jun. 3, 2010

(30) Foreign Application Priority Data

Nov. 28, 2008 (JP) ................. 2008-304665

(51) Int. Cl.
- H05K 1/00 (2006.01)
- H05K 3/00 (2006.01)
- H05K 1/14 (2006.01)
- H05K 3/46 (2006.01)

(52) U.S. Cl.
CPC .............. *H05K 1/142* (2013.01); *H05K 3/4602* (2013.01); *H05K 2201/0187* (2013.01); *H05K 3/4694* (2013.01); *H05K 2201/2018* (2013.01)
USPC ............................................ 174/260; 29/829

(58) Field of Classification Search
CPC .............................. H05K 1/142; H05K 3/4694
USPC ........................................................ 174/250
See application file for complete search history.

(56) References Cited

U.S. PATENT DOCUMENTS

| 6,930,255 | B2 * | 8/2005 | Wakihara et al. | 174/250 |
| 2004/0231885 | A1 * | 11/2004 | Borland et al. | 174/260 |
| 2007/0030628 | A1 | 2/2007 | Yamamoto et al. | |
| 2009/0025961 | A1 * | 1/2009 | Kanemaru et al. | 174/250 |
| 2009/0025971 | A1 * | 1/2009 | Kanemaru et al. | 174/260 |
| 2009/0166077 | A1 * | 7/2009 | Hirakawa | 174/262 |

FOREIGN PATENT DOCUMENTS

| JP | 8-97564 | 4/1996 |
| JP | 2001-352141 A | 12/2001 |
| JP | 2002-232089 | 8/2002 |
| JP | 2002-289986 | 10/2002 |
| JP | 2002-344146 A | 11/2002 |
| JP | 2003-69190 | 3/2003 |
| JP | 2004-87786 | 3/2004 |
| JP | 2005-322878 | 11/2005 |
| JP | 2007-67369 | 3/2007 |
| JP | 2007-115855 | 5/2007 |
| JP | 2007-258541 A | 10/2007 |

OTHER PUBLICATIONS

U.S. Appl. No. 12/537,656, filed Aug. 7, 2009, Takahashi.

* cited by examiner

*Primary Examiner* — William H Mayo, III
*Assistant Examiner* — Hiram E Gonzalez
(74) *Attorney, Agent, or Firm* — Oblon, Spivak, McClelland, Maier & Neustadt, L.L.P.

(57) ABSTRACT

A wiring board includes an insulating board, a wiring sub board having a wiring layer, and an insulating layer. The insulating layer has a via hole in which a conductor is formed by plating. The insulating board and the wiring sub board are horizontally laid out. The insulating layer is laid out to cover a boundary portion between the insulating board and the wiring sub board and continuously extends from the insulating board to the wiring sub board. A resin which constitutes the insulating layer is filled in the boundary portion. The conductor is electrically connected to the wiring layer.

18 Claims, 14 Drawing Sheets

WIRING BOARD AND FABRICATION METHOD THEREFOR

CROSS REFERENCE TO RELATED APPLICATIONS

The present application claims the benefits of priority to Japanese Patent Application No. 2008-304665, which was filed on Nov. 28, 2008. The entire contents of Japanese Patent Application No. 2008-304665 are herein incorporated by reference.

BACKGROUND OF THE INVENTION

1. Field of the Invention

The present invention relates to a wiring board having an insulating board and a plurality of wiring sub boards, and a method of fabricating the wiring board.

2. Description of the Related Art

For example, Patent Documents Unexamined Japanese Patent Application Publication No. 2002-289986, Unexamined Japanese Patent Application Publication No. 2002-232089, Unexamined Japanese Patent Application Publication No. 2007-115855 and Unexamined Japanese Patent Application Publication No. 2005-322878 describe wiring boards and fabrication methods therefor. Those wiring boards each have an insulating board and wiring sub boards connected to the insulating board.

The contents of Unexamined Japanese Patent Application Publication No. 2002-289986, Unexamined Japanese Patent Application Publication No. 2002-232089, Unexamined Japanese Patent Application Publication No. 2007-115855 and Unexamined Japanese Patent Application Publication No. 2005-322878 are herein incorporated in their entirety.

SUMMARY OF THE INVENTION

According to the first aspect of the invention, a wiring board includes: a wiring sub board having a conductive pattern; an insulating board being laid out alongside of the wiring sub board; and an insulating layer having a via hole in which a conductor to be electrically connected to the conductive pattern is formed by plating, the insulating layer continuously extending from the insulating board to the wiring sub board so as to cover a boundary portion between the insulating board and the wiring sub board. An insulating material for the insulating layer is filled in the boundary portion between the insulating board and the wiring sub board.

According to the second aspect of the invention, a fabrication method for a wiring board includes: horizontally laying an insulating board formed of an insulating material and a wiring sub board having a wiring layer; laying an insulating layer to cover a boundary portion between the insulating board and the wiring sub board; filling an insulating material for the insulating layer in the boundary portion between the insulating board and the wiring sub board; forming a via hole in the insulating layer and forming a conductor in the via hole by plating; and electrically connecting the conductor formed in the via hole to the wiring layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTIONS OF THE EMBODIMENT

The embodiment will now be described with reference to the accompanying drawings, wherein like reference numerals designate corresponding or identical elements throughout the various drawings.

Figure 1A:
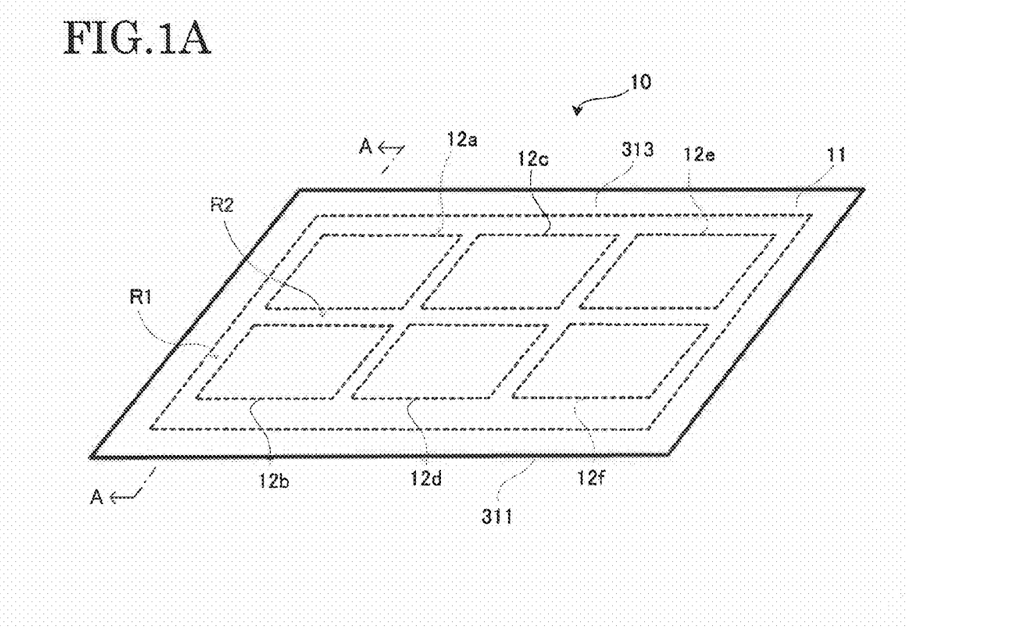
FIG. 1A is a diagram showing the outline of a wiring board according to one embodiment of the present invention.
Figure 1B:
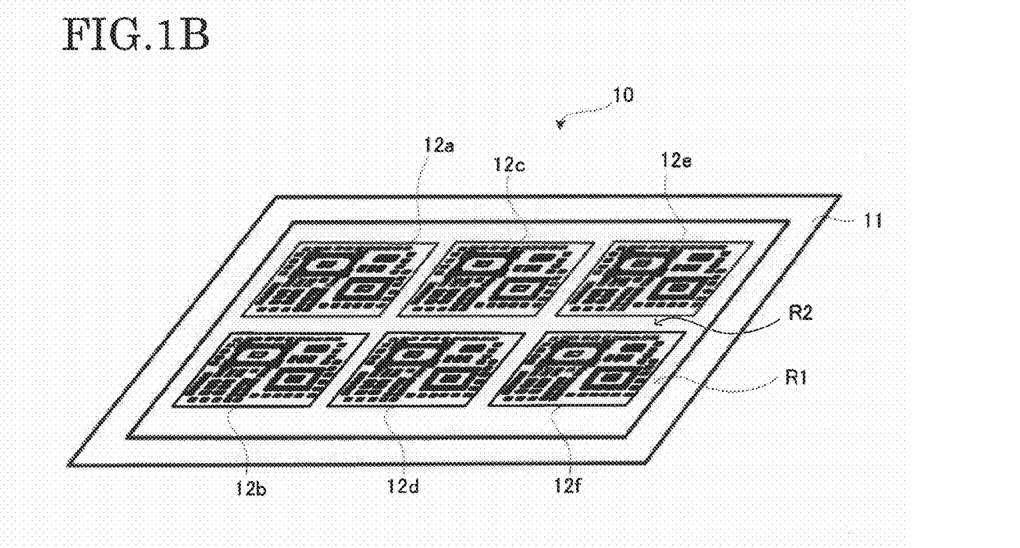
FIG. 1B is a diagram showing the internal structure of the wiring board according to the embodiment of the invention.

A wiring board 10 according to an embodiment, which has the outline as shown in FIG. 1A and the internal structure as shown in FIG. 1B, for example, has an insulating board 11 as a frame, and wiring sub boards 12a, 12b, 12c, 12d, 12e and 12f. The insulating board 11 and the wiring sub boards 12a to 12f are laid out horizontally through a boundary portion R1, and the wiring sub boards 12a to 12f are laid out horizontally through a boundary portion R2. A sixth insulating layer 313 and a fifth insulating layer 311 are formed on the top sides and bottom sides of the insulating board 11 and the wiring sub boards 12a to 12f. FIG. 1B shows the internal structure of the wiring board 10 with the fifth and sixth insulating layers 311 and 313 omitted.

The insulating board 11 is an insulating board made of, for example, a glass epoxy resin or the like. Particularly, as shown in FIGS. 1A and 1B, the insulating board 11 is a quadrate frame surrounding the wiring sub boards 12a to 12f. The wiring sub boards 12a to 12f are laid out inside the insulating board 11. The shape of the insulating board 11 is optional. For example, the insulating board 11 may have a circular shape or an elliptical shape, or may be two thin elongated bars sandwiching the wiring sub boards aligned in a row.

The wiring sub boards 12a to 12f are rectangular rigid boards. The shapes of the wiring sub boards 12a to 12f are optional, and may be, for example, a parallelepiped shape, a circular shape, an elliptical shape or so. The wiring sub boards 12a to 12f are not electrically connected to one another.

Figure 2:
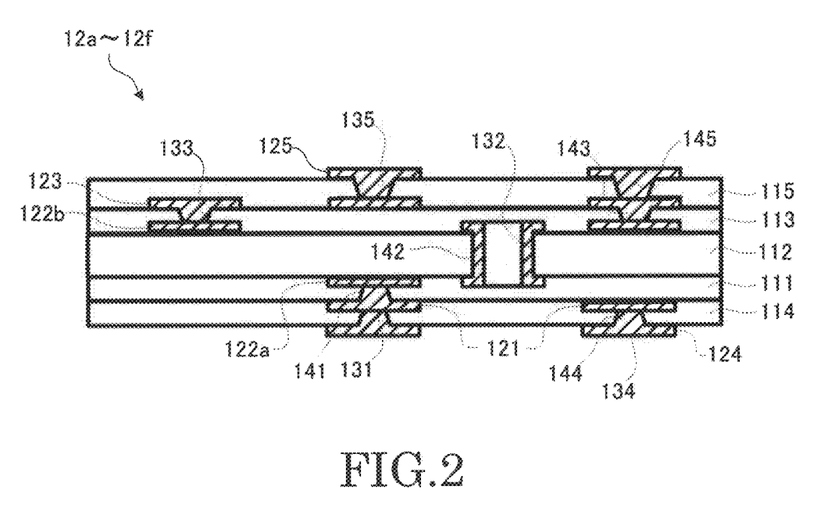
FIG. 2 is a cross-sectional view of a wiring sub board constituting the wiring board.

Each of the wiring sub boards 12a to 12f whose cross-sectional structures are shown in FIG. 2 is a so-called build-up multi-layer printed wiring board. That is, each of the wiring sub boards 12a to 12f has a rigid base 112, first and second insulating layers 111 and 113, and third and fourth insulating layers 114 and 115 laminated.

The rigid base 112 is made of, for example, a rigid insulating material. Specifically, the rigid base 112 is made of a glass epoxy resin or the like with a thickness of, for example, about 50 to 150 μm, desirably about 100 μm.

Formed at top and bottom sides of the rigid base 112 are first to fourth insulating layers 111, 113 to 115 made of, for example, a hardened prepreg, wiring layers 122a, 122b, 121, 123 to 125 made of, for example, copper, and via holes (interlayer connected portions) 131, 133 to 135. Conductors 141, 143 to 145 of, for example, copper, are filled in the via holes 131, 133 to 135 to electrically connect the individual wiring layers to one another. A through hole 132 is formed in the rigid base 112. The through hole 132 is formed by, for example, boring a hole in the conductor 142 of copper or the like through and plating the hole to electrically connect the wiring layers 122a and 122b at the top and bottom of the rigid base 112.

More specifically, the wiring layers 122b, 122a are respectively formed on the top and bottom sides of the rigid base 112, and are electrically connected to the overlying respective wiring layers 121, 123 through the via holes 131, 133 and the conductors 141, 143. Further, the wiring layers 121, 123 are electrically connected to the overlying respective wiring layers 124, 125 through the via holes 134, 135 and the conductors 144, 145.

Figure 3:
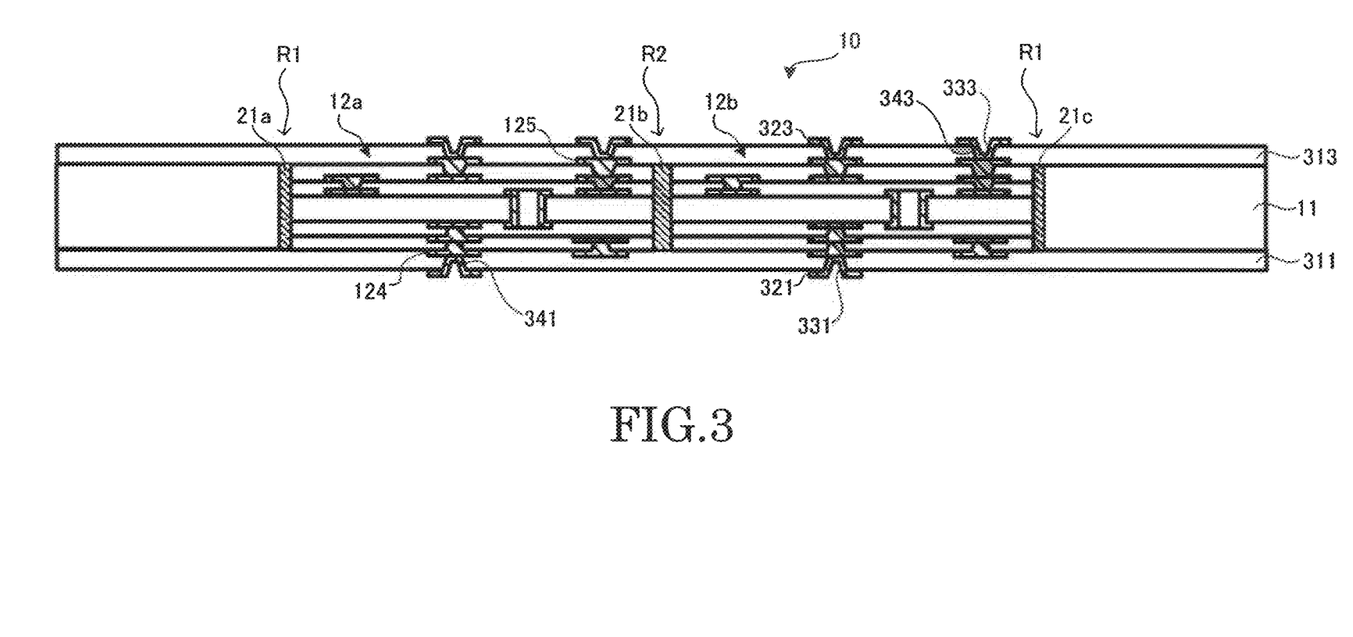
FIG. 3 is a cross-sectional view along line A-A in FIG. 1A.

As shown in FIG. 3 (cross-sectional view along line A-A in FIG. 1A), for example, the sixth and fifth insulating layers 313, 311 are respectively formed on the top and bottom sides of the insulating board 11 and the wiring sub boards 12a to 12f. The fifth and sixth insulating layers 311, 313 are laid out to cover the boundary portion R1 between the insulating board 11 and the wiring sub boards 12a to 12f, and the boundary portion R2 (see FIGS. 1A and 1B) between the wiring sub boards 12a to 12f. The fifth and sixth insulating layers 311 and 313 continuously extend from the insulating board 11 to the wiring sub boards 12a to 12f.

Via holes 331, 333 are formed in the fifth and sixth insulating layers 311, 313, respectively. Conductors 341, 343 of copper, for example, are formed in the via holes 331, 333. The conductors 341, 343 are electrically connected to the wiring layers 124, 125 of the wiring sub boards 12a to 12f, respectively. The wiring sub boards 12a to 12f are not electrically connected to one another.

The fifth and sixth insulating layers 311 and 313 are formed of a rigid insulating material, such as a hardened prepreg. It is desirable that the prepregs of the first to sixth insulating layers 111, 113 to 115, 311, 313 should contain a resin having the low-flow property. Such prepregs can be produced by performing pre-hardening beforehand by, for example, impregnating a glass cloth with an epoxy resin, then thermally hardening the resin. The glass cloth may be impregnated with a high viscosity resin, or impregnated with a resin containing an inorganic filler (e.g., silica filler), or the resin contain of the glass cloth may be decreased. An RCF (Resin Coated copper Foil) or the like may be used in place of the prepreg.

Insulating resins 21a to 21c (insulating materials) leaked out (flowed out) from the fifth and sixth insulating layers 311 and 313 are filled between the insulating board 11 and the wiring sub boards 12a to 12f, and between the wiring sub boards 12a to 12f. Accordingly, the wiring sub boards 12a to 12f are secured at predetermined positions. This therefore requires no bridges or the like to couple the insulating board 11 to the wiring sub boards 12a to 12f. The use of the resins 21a to 21c leaked from the fifth and sixth insulating layers 311 and 313 also eliminates the need for an adhesive or the like.

Figure 4:
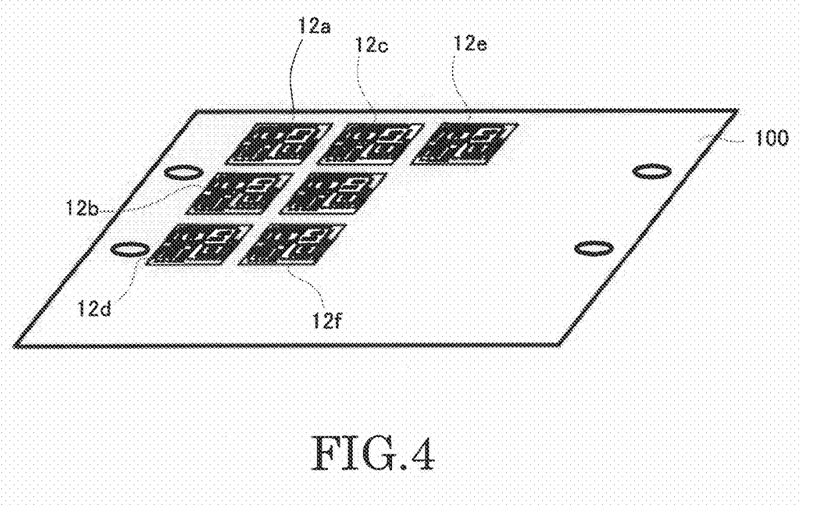
FIG. 4 is a diagram for explaining a step of producing the wiring sub board at a production panel.

In fabricating the wiring board 10, first, the wiring sub boards 12a to 12f are produced at a production panel 100 as shown in FIG. 4, for example. The production panel 100 is a dedicated production panel at which wiring sub boards having the same structure (structure shown in FIG. 2) including the wiring sub boards 12a to 12f are produced.

The wiring sub boards 12a to 12f are produced separately from the insulating board 11 according to the fabrication method of the embodiment. This makes it possible to produce a larger number of wiring sub boards 12a to 12f at the production panel 100, thus improving the yield or the number of yielded products.

Figure 5A:
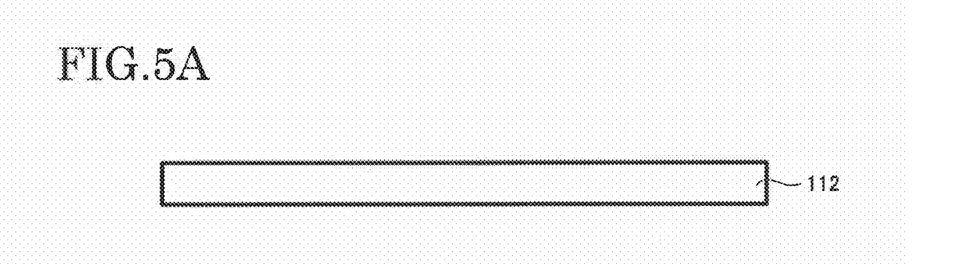
FIGS. 5A-5C are diagrams for explaining a step of forming a first layer of the wiring sub board.

In producing the wiring sub boards 12a to 12f, first, a material common to a plurality of products is cut with, for example, a laser or the like to prepare the rigid base 112 with a predetermined shape and size as shown in FIG. 5A.

Figure 5B:
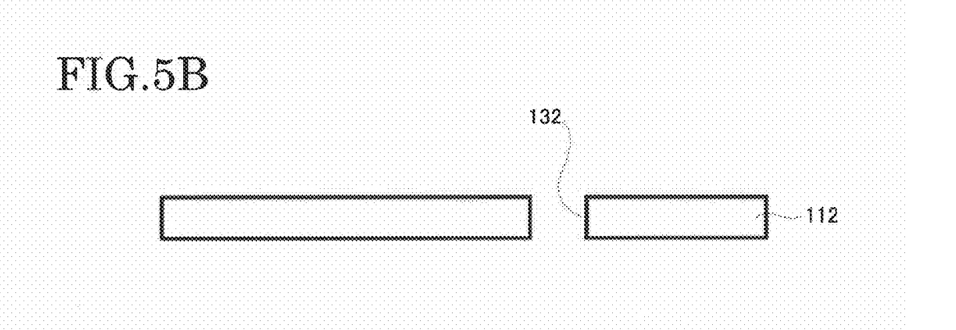

Then, after predetermined pre-processing, for example, the through hole 132 is formed as shown in FIG. 5B by irradiating, for example, a $CO_2$ laser beam from a $CO_2$ laser processing apparatus.

Figure 5C:
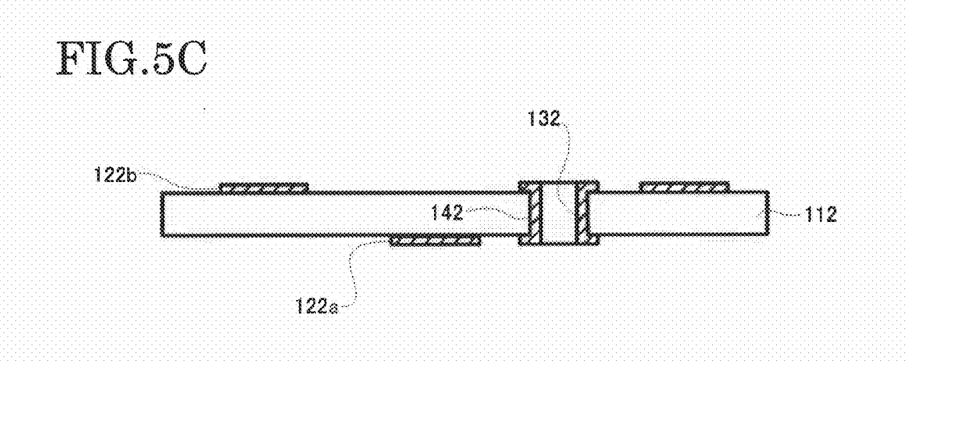

Subsequently, after desmearing (smear removal) and soft etching are carried out, PN plating (e.g., chemical copper plating and electric copper plating) is performed. As a result, a conductive film is formed on the entire surface of the rigid base 112 including the interior of the through hole 132. Then, the conductive film is made thinner to a predetermined thickness by, for example, half etching, the conductive film is patterned as shown in FIG. 5C through, for example, a predetermined lithography process (pre-processing, lamination, exposure, development, etching, film separation, inspection of internal layers, etc.). As a result, the wiring layers 122a and 122b and the conductor 142 are formed.

Figure 6A:
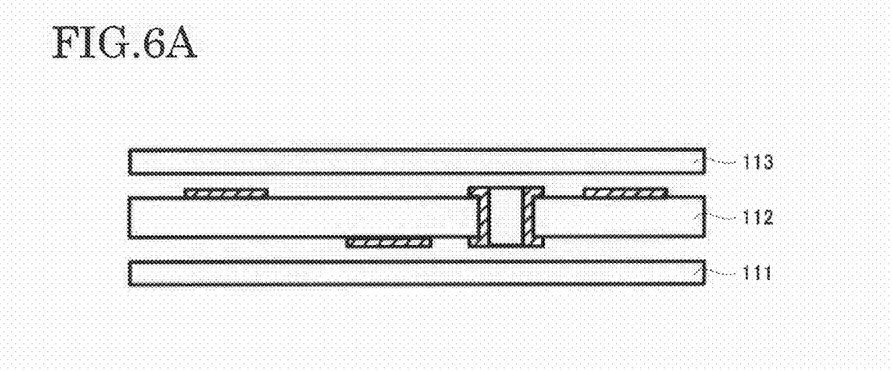
FIGS. 6A-6C are diagrams for explaining a step of forming a second layer of the wiring sub board.
Figure 6B:
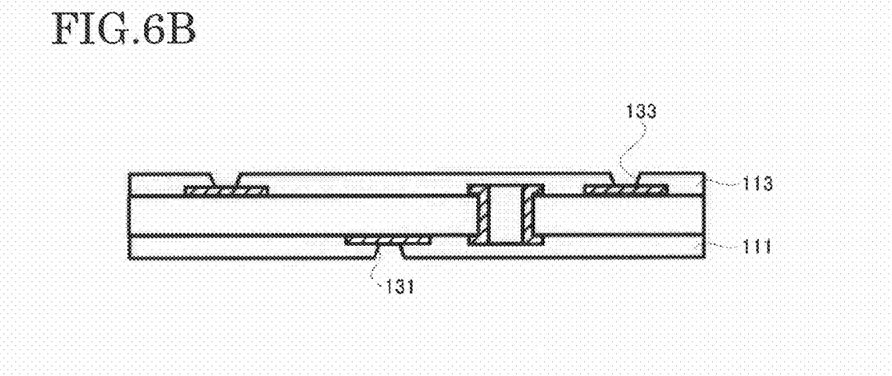
Figure 6C:
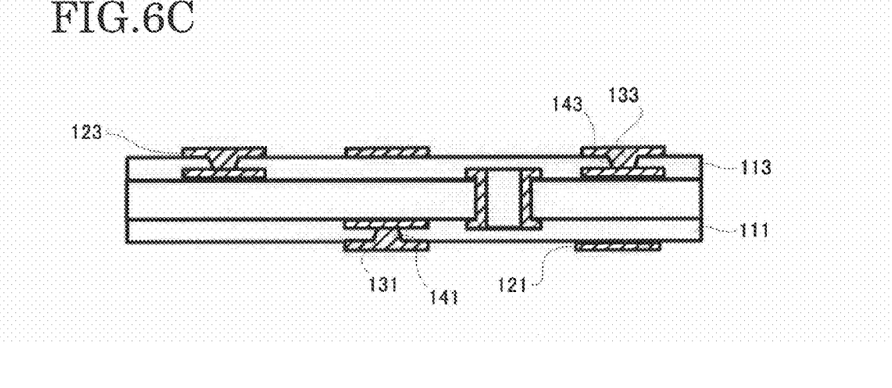

Subsequently, as shown in FIG. 6A, for example, the second insulating layer 113 and the first insulating layer 111 are disposed on the top and bottom sides of the wiring board. Then, they are pressed (e.g., hot-pressed). Thereafter, the resin is hardened in, for example, a heat treatment or the like, to solidify the first and second insulating layers 111 and 113. Then, after predetermined pre-processing, as shown in FIG. 6B, the via hole 131 is formed in the first insulating layer 111 and the via hole 133 is formed in the second insulating layer 113 with a laser, for example. Then, after desmearing (smear removal) and soft etching are carried out, PN plating (e.g., chemical copper plating and electric copper plating) is performed. As a result, a conductive film is formed on the entire surface of the wiring board including the via holes 131 and 133. Then, the conductive film on the surface of the wiring board is made thinner to a predetermined thickness by, for example, half etching, the conductive film is patterned as shown in FIG. 6C through, for example, a predetermined lithography process (pre-processing, lamination, exposure, development, etching, film separation, inspection of internal layers, etc.). As a result, the conductors 141 and 143, and the wiring layers 121 and 123 are formed. Thereafter, the top surfaces of the wiring layers 121 and 123 are processed to form rough surfaces. The wiring layers 121 and 123 can also be formed by printing a conductive paste (e.g., thermoset resin containing conductive particles) by, for example, screen printing.

Figure 7A:
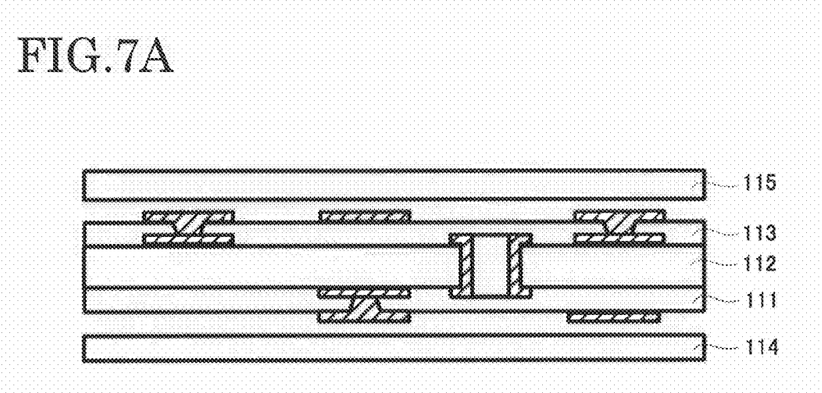
FIGS. 7A-7B are diagrams for explaining a step of forming a third layer of the wiring sub board.
Figure 7B:
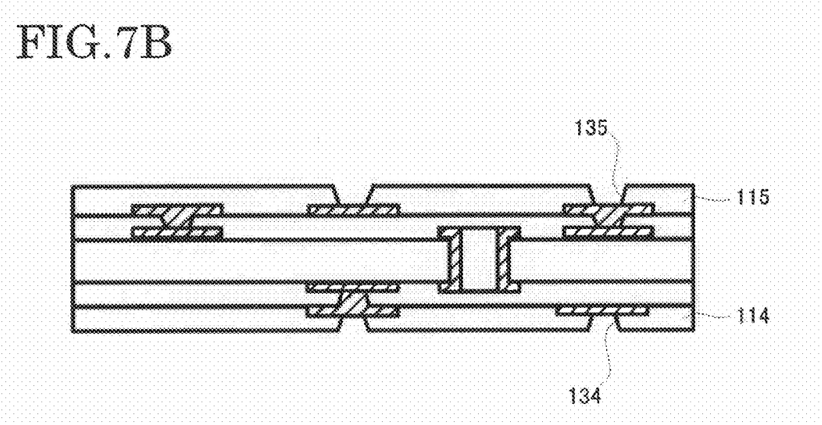

Subsequently, as shown in FIG. 7A, for example, the fourth insulating layer 115 and the third insulating layer 114 are disposed on the top and bottom sides of the wiring board. Then, they are pressed (e.g., hot-pressed). Thereafter, the resin is hardened in, for example, a heat treatment or the like, to solidify the third and fourth insulating layers 114 and 115. Then, after predetermined pre-processing, as shown in FIG. 7B, the via hole 134 is formed in the third insulating layer 114 and the via hole 135 is formed in the fourth insulating layer 115 with a laser, for example. Further, through steps similar to those shown in FIG. 6C, the conductors 144 and 145, and the wiring layers 124 and 125 as shown in FIG. 2 are formed. As a result, the wiring sub boards 12a to 12f are produced at the production panel 100 as shown in FIG. 4.

Figure 8:
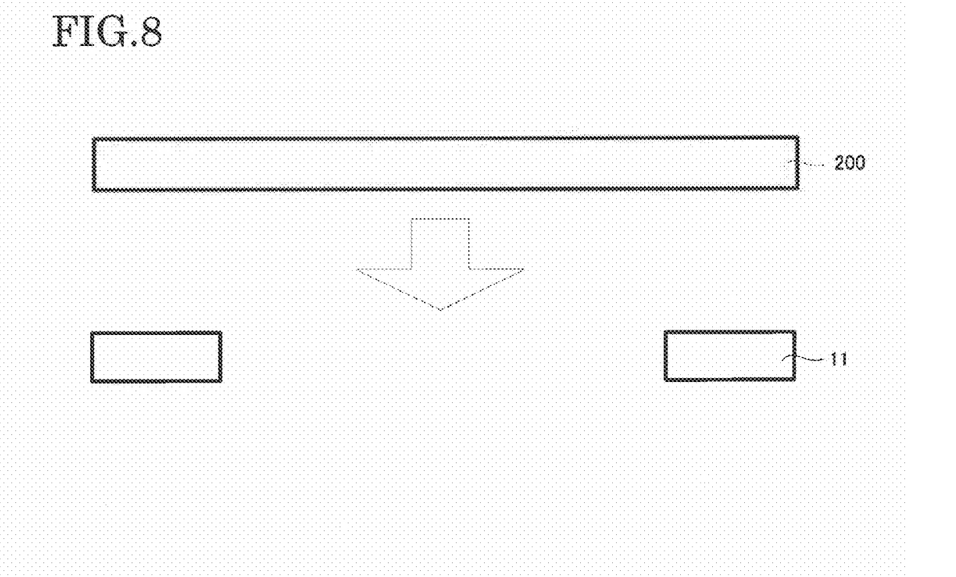
FIG. 8 is a diagram for explaining a step of fabricating the insulating board.
Figure 9:
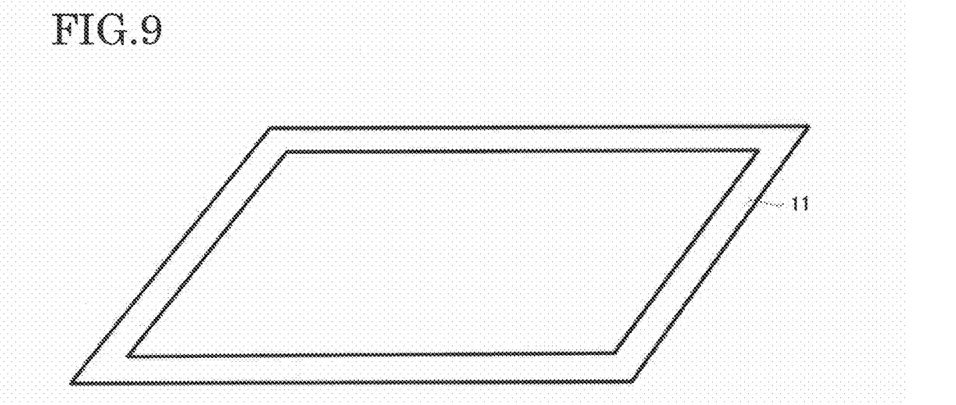
FIG. 9 is a diagram showing the outline the insulating board.

Before or after producing the wiring sub boards 12a to 12f, the insulating board 11 is produced. Specifically, as shown in FIG. 8, a material (production panel 200) common to a plurality of products is cut with, for example, a laser or the like to produce the insulating board 11 with a predetermined shape and size. Accordingly, a quadrate frame shown in FIG. 9 as the insulating board 11 is obtained. As the insulating board 11 is produced separately from the wiring sub boards 12a to 12f, an unnecessary laminate is not formed on the insulating board 11. This reduces the consumption of the conductive materials, insulating materials and so forth. This results in reduction in fabrication cost.

Figure 10:
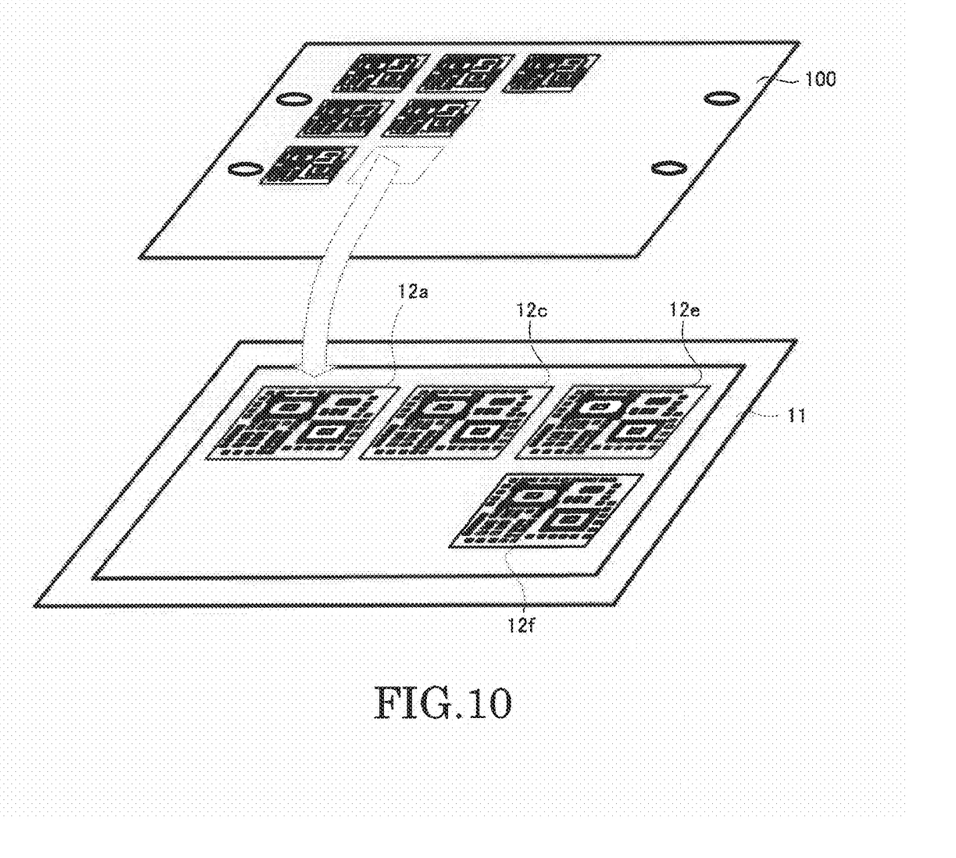
FIG. 10 is a diagram for explaining a step of laying out the wiring sub board.

Next, the wiring sub boards 12a to 12f are respectively separated from the production panel 100, and are laid out inside the insulating board 11 as shown in FIG. 10. Before separation of the wiring sub boards 12a to 12f from the production panel 100, an electrification test or the like is performed on the wiring sub boards 12a to 12f. This allows any defective board to be removed so that defect-free boards are used. That is, defect-free boards are laid out inside the insulating board 11.

According to the fabrication method of the embodiment, a defective board can be found and removed before forming the outermost layer, i.e., at an earlier stage. It is therefore possible to reduce the consumption of materials which would occur in case of defective boards present. This results in reduction in fabrication cost.

The positional alignment of the wiring sub boards 12a to 12f before forming the outermost layer can easily achieve high-precision alignment.

Figure 11A:
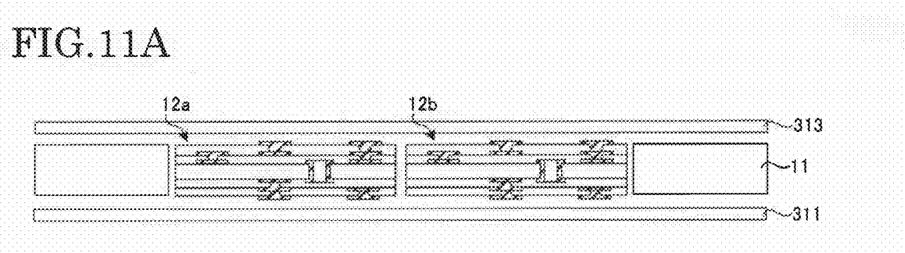
FIGS. 11A-11D are diagrams for explaining a step of forming insulating layers on both sides of the insulating board and the wiring sub board.
Figure 11B:
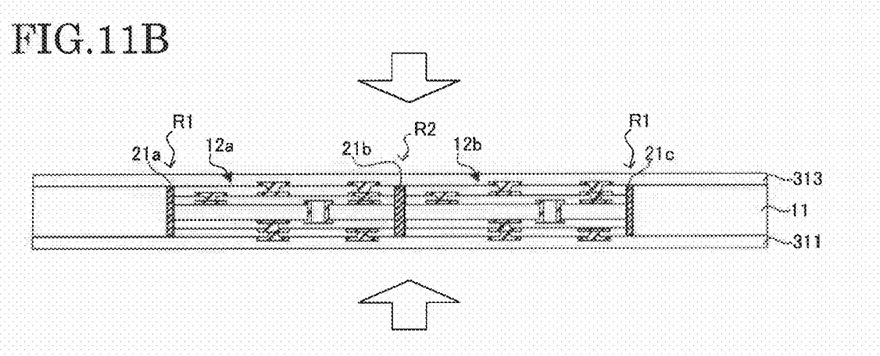

Subsequently, as shown in FIG. 11A, for example, the sixth and fifth insulating layers 313, 311 are disposed on the top and bottom sides of the wiring sub boards 12a to 12f (only 12a and 12b shown in FIGS. 11A to 11D) and the insulating board 11. Then, they are pressed (e.g., hot-pressed) as shown in FIG. 11B. Accordingly, the resins 21a to 21c are extruded from the fifth and sixth insulating layers 311 and 313. That is, the pressing causes the resins 21a to 21c to leak out (flow out) from the prepregs constituting the fifth and sixth insulating layers 311 and 313 to be filled in the boundary portion R1 between the insulating board 11 and the wiring sub boards 12a to 12f, and the boundary portion R2 between the wiring sub boards 12a to 12f. As the sixth and fifth insulating layers 313, 311 are formed on the top and bottom sides of the insulating board 11 and the wiring sub boards 12a to 12f at this time, the resins 21a to 21c are filled from both sides. Thereafter, the fifth and sixth insulating layers 311 and 313 are solidified by hardening the resins through, for example, a heat treatment or the like.

Figure 11C:
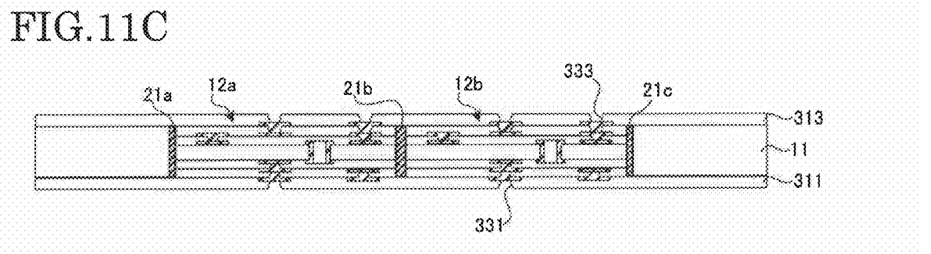
Figure 11D:
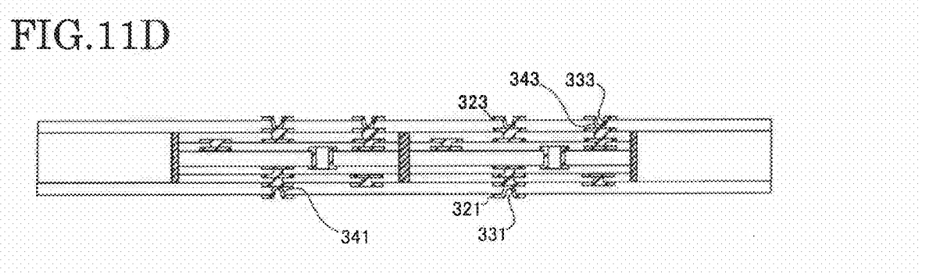

Subsequently, after predetermined pre-processing, as shown in FIG. 11C, the via hole 331 is formed in the fifth insulating layer 311, and the via hole 333 is formed in the sixth insulating layer 313 with, for example, a laser. Then, after desmearing (smear removal) and soft etching are carried out, PN plating (e.g., chemical copper plating and electric copper plating) is performed. As a result, a conductive film is formed on the entire surface of the wiring board including the via holes 331 and 333. Subsequently, the conductive film on the surface of the wiring board is made thinner to a predetermined thickness by, for example, half etching, the conductive film is patterned as shown in FIG. 11D through, for example, a predetermined lithography process (pre-processing, lamination, exposure, development, etching, film separation, inspection of internal layers, etc.). As a result, the conductors 341 and 343, and the wiring layers 321 and 323 are formed.

Figure 12:
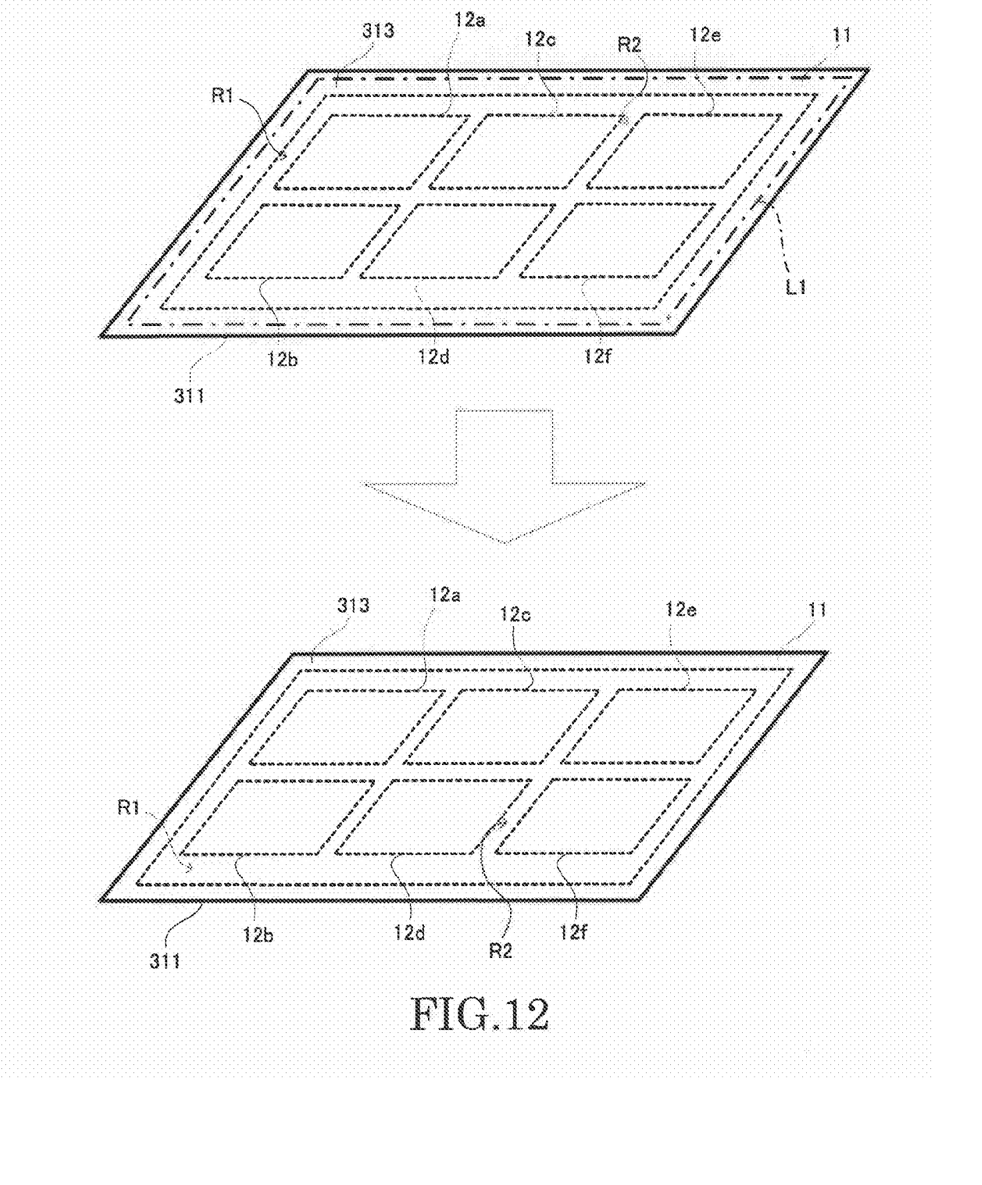
FIG. 12 is a diagram for explaining a step of performing outline processing on the wiring board.

Thereafter, outline processing of the wiring board is performed as shown in, for example, FIG. 12, using a router, for example. In the outline processing, the wiring board is processed to a predetermined shape (e.g., quadrate shape) like a cut line L1 in the diagram within the widthwise range of the frame of the insulating board 11.

The wiring board 10 shown in FIG. 3 is fabricated this way. That is, the fifth and sixth insulating layers 311 and 313, and the wiring layers 321 and 323 in the wiring board 10 become the outermost layers.

While the wiring board and fabrication method according to the embodiment have been described, the present invention is not limited to the embodiment.

The wiring sub boards 12a to 12f are not electrically connected to one another in the embodiment, which is not restrictive. For example, the wiring sub boards 12a to 12f may be electrically connected to one another according to the purpose or the like.

Figure 13A:
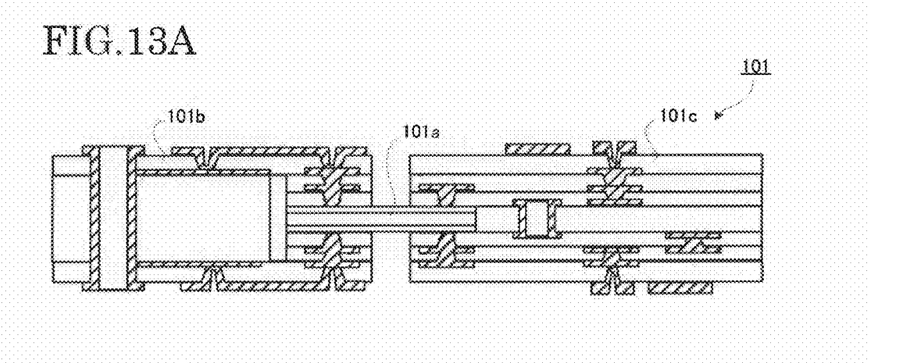
FIG. 13A is a diagram showing another example of the wiring sub board.
Figure 13B:
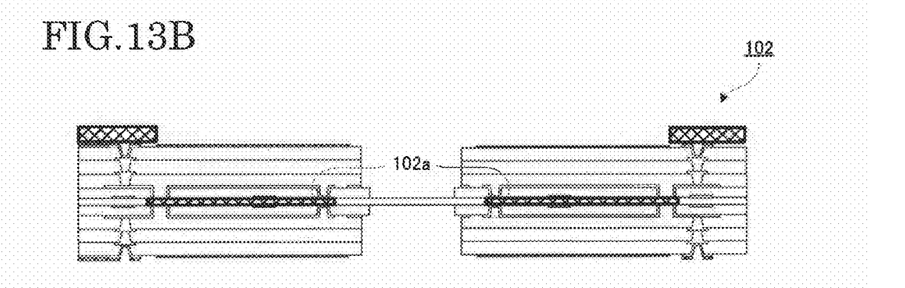
FIG. 13B is a diagram showing a different example of the wiring sub board.
Figure 13C:
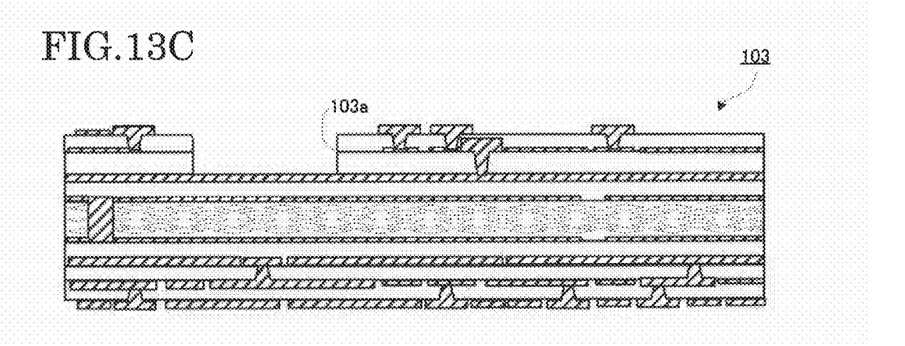
FIG. 13C is a diagram showing a further example of the wiring sub board.
Figure 14:
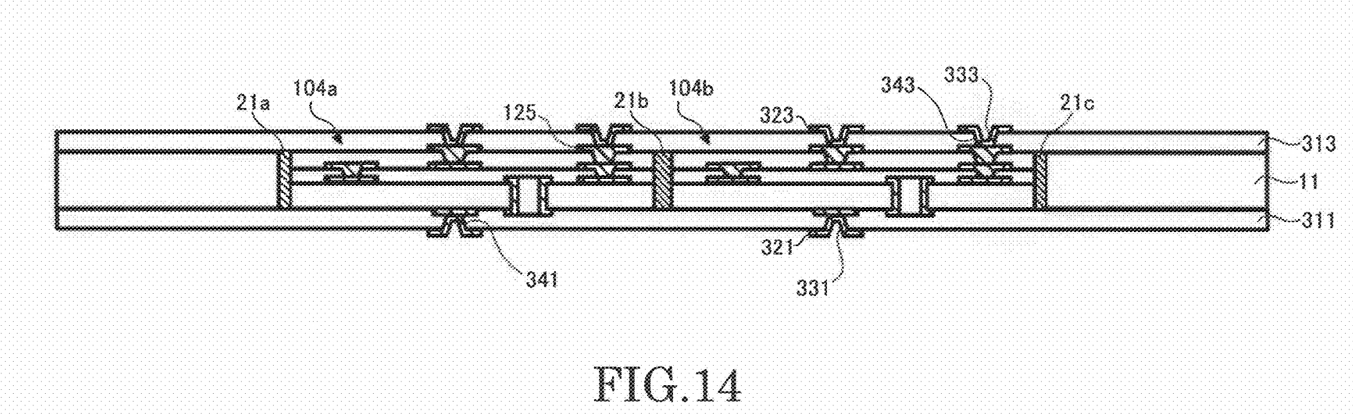
FIG. 14 is a cross-sectional view showing an example of a wiring board having a one-side wiring sub board.

The wiring sub boards 12a to 12f are not limited to those shown in FIG. 2. For example, the boards may be flexible printed wiring boards. Further, the wiring sub board may be a flex-rigid printed wiring board 101 having a flexible part 101a and rigid parts 101b and 101c as shown in FIG. 13A. Furthermore, the wiring sub board may be a printed wiring board 102 incorporating an electronic part 102a as shown in FIG. 13B, for example. As another option, the wiring sub board may be a printed wiring board 103 having a cavity 103a formed in the top surface thereof as shown in FIG. 13C. The wiring sub board may be a one-side printed wiring board 104a, 104b having wiring layers and insulating layers laminated only on one side of the core, as shown in FIG. 14 (cross-sectional view corresponding to FIG. 3).

The materials and sizes of the individual layers, the number of the layers, and so forth may be changed in the embodiment.

Figure 15:
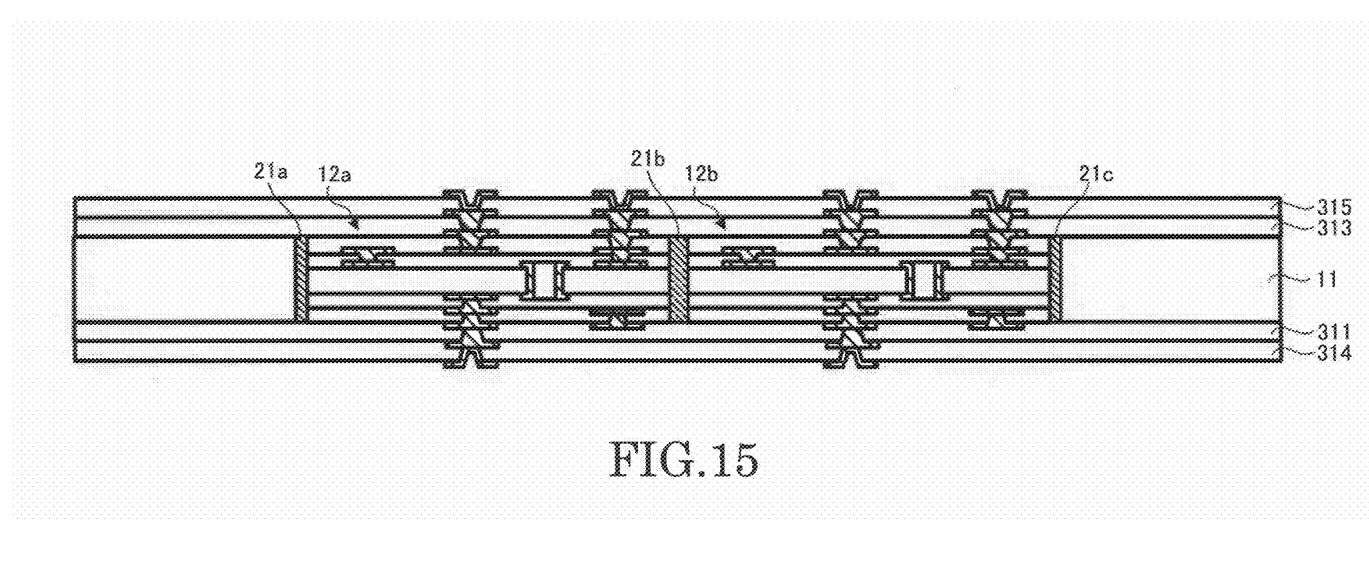
FIG. 15 is a diagram showing another example of the wiring board.

For example, single-layer insulating layers, i.e., the sixth and fifth insulating layers 313, 311 are formed on the top and bottom sides of the insulating board 11 and the wiring sub boards 12a to 12f in the embodiment, which is not restrictive. For example, as shown in FIG. 15, multiple insulating layers of different materials, i.e., the sixth and eight insulating layers 313 and 315, and the fifth and seventh insulating layers 311 and 314 may be formed on the top and bottom sides of the insulating board 11 and the wiring sub boards 12a to 12f.

Although the wiring board 10 having six wiring sub boards 12a to 12f is exemplified in the foregoing description of the embodiment, the number of wiring sub boards is optional. That is, the quantity may be one, two to five, or seven or greater.

The sequential order of the processes in the embodiment may be changed without departing from the scope and spirit of the invention. Some processes may be omitted according to the purpose or the like.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board comprising:
   a frame;
   a plurality of wiring sub boards positioned inside an area defined by the frame and each comprising a multilayer printed wiring board comprising a rigid core, at least one resin insulating layer formed on the rigid core, and at least one wiring layer formed on the resin insulating layer, the multilayer printed wiring board having a first conductive pattern on a first surface of the wiring sub board and a second conductive pattern on a second surface of the wiring sub board on an opposite side of the first surface, said plurality of sub boards not electrically connected to one another;
   a first insulating layer formed over the wiring sub boards and the frame such that the first insulating layer is continuously extending from the frame to the wiring boards and covering a boundary portion between the frame and the wiring sub boards and a boundary portion between the wiring sub boards on one side of the frame; and
   a second insulating layer formed over the wiring sub boards and the frame such that the second insulating layer is continuously extending from the frame to the wiring sub boards and covering the boundary portion between the frame and the wiring sub boards and the boundary portion between the wiring sub boards on an opposite side of the frame,
   wherein each of the first insulating layer and the second insulating layer has no conductive wiring pattern formed directly on the frame, the first insulating layer comprises an insulating material and has a via hole in which a first conductor comprising a plating material is formed such that the first conductor is electrically connected to the first conductive pattern through the via hole in the first insulating layer, the second insulating layer comprises an insulating material and has a via hole in which a second conductor comprising a plating material is formed such that the second conductor is electrically connected to the second conductive pattern through the via hole in the second insulating layer, and the boundary portion between the frame and the wiring sub boards and the boundary portion between the wiring sub boards are filled with the insulating material derived from at least one of the first insulating layer and the second insulating layer such that said plurality of sub boards are not electrically connected to one another.

2. The wiring board according to claim 1, wherein the insulating material of each of the first and second insulating layers comprises a resin, and the insulating material filling the boundary portion is the resin flowing out from at least one of the first and second insulating layers.

3. The wiring board according to claim 1, wherein each of the first and second insulating layers comprises a plurality of insulating materials.

4. The wiring board according to claim 1, wherein the first insulating layer comprises a prepreg comprising a resin having a low-flow property, and the second insulating layer comprises a prepreg comprising a resin having a low-flow property.

5. The wiring board according to claim 1, further comprising:
   a first wiring layer formed on the first insulating layer; and
   a second wiring layer formed on the second insulating layer.

6. The wiring board according to claim 1, further comprising:
   a first wiring layer formed on the first insulating layer; and
   a second wiring layer formed on the second insulating layer,
   wherein the first insulating layer comprises a prepreg comprising a resin having a low-flow property, and the second insulating layer comprises a prepreg comprising a resin having a low-flow property.

7. The wiring board according to claim 1, wherein the frame has a quadrate frame surrounding the plurality of wiring sub boards.

8. The wiring board according to claim 1, wherein the first insulating layer comprises a resin having a low-flow property, and the second insulating layer comprises a resin having a low-flow property.

9. The wiring board according to claim 1, further comprising:
   a first wiring layer formed on the first insulating layer; and
   a second wiring layer formed on the second insulating layer,
   wherein the first insulating layer comprises a resin having a low-flow property, and the second insulating layer comprises a resin having a low-flow property.

10. The wiring board according to claim 1, wherein the multilayer printed wiring board of each of the wiring sub boards further comprises a through hole formed through the rigid core.

11. The wiring board according to claim 1, wherein the first insulating layer is a single-layer insulating layer, and the second insulating layer is a single-layer insulating layer.

12. The wiring board according to claim 1, wherein the first insulating layer is an outermost single-layer insulating layer, the second insulating layer is an outermost single-layer insulating layer, and no insulation is formed on the first insulating layer or the second insulation layer.

13. The wiring board according to claim 1, wherein the frame comprises a plurality of bars sandwiching the wiring sub boards.

14. The wiring board according to claim 1, wherein each of the first insulating layer and the second insulating layer comprises a first region formed directly above the plurality of wiring sub boards, a second region formed directly above the frame,
   the wiring board further comprising a conductive pattern formed entirely within the first region of the first or second insulating layer.

15. The wiring board according to claim 1, wherein the frame is made of an insulating board.

16. The wiring board according to claim 14, wherein the first insulating layer is an outermost single-layer insulating layer, the second insulating layer is an outermost single-layer insulating layer, the frame is made of an insulating board, and no insulation is formed on the first insulating layer or the second insulation layer.

17. The wiring board according to claim 1, wherein the rigid core is made of a glass epoxy resin.

18. The wiring board according to claim 1, wherein the rigid core has a thickness of about 50 to 150 μm.

\* \* \* \* \*